(12) United States Patent
Kikuchi

(10) Patent No.: US 10,971,623 B2
(45) Date of Patent: Apr. 6, 2021

(54) SEMICONDUCTOR DEVICE AND METHOD FOR MANUFACTURING THE SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Takuo Kikuchi, Kamakura (JP)

(73) Assignees: KABUSHIKI KAISHA TOSHIBA, Minato-ku (JP); TOSHIBA ELECTRONIC DEVICES & STORAGE CORPORATION, Minato-ku (JP)

(*) Notice: Subject to any disclaimer, the term of this patent is extended or adjusted under 35 U.S.C. 154(b) by 0 days.

(21) Appl. No.: 16/357,567

(22) Filed: Mar. 19, 2019

(65) Prior Publication Data

US 2020/0083372 A1 Mar. 12, 2020

(30) Foreign Application Priority Data

Sep. 11, 2018 (JP) .............................. JP2018-169710

(51) Int. Cl.
*H01L 29/78* (2006.01)
*H01L 29/10* (2006.01)
*H01L 29/66* (2006.01)

(52) U.S. Cl.
CPC ...... *H01L 29/7827* (2013.01); *H01L 29/1033* (2013.01); *H01L 29/66666* (2013.01)

(58) Field of Classification Search
CPC .......................... H01L 29/7827; H01L 29/1033
See application file for complete search history.

(56) References Cited

U.S. PATENT DOCUMENTS

| 6,700,141 B2* | 3/2004 | Iwamoto ............. H01L 29/0634 257/110 |
| 2003/0132450 A1 | 7/2003 | Minato et al. |

(Continued)

FOREIGN PATENT DOCUMENTS

| JP | WO 2002/067333 A1 | 8/2002 |
| JP | 2008-205431 A | 9/2008 |

(Continued)

*Primary Examiner* — Trang Q Tran
(74) *Attorney, Agent, or Firm* — Oblon, McClelland, Maier & Neustadt, L.L.P.

(57) ABSTRACT

A semiconductor device includes a semiconductor body, first and second electrodes and a control electrode. The semiconductor body is positioned between the first and second electrodes. The control electrode is provided between the semiconductor body and the first electrode. The semiconductor body includes a first layer of a first conductivity-type and a second layer of a second conductivity-type alternately arranged along the first electrode. The first and second layers include first and second low-concentration portions, respectively. The first low-concentration portion has a first conductivity-type impurity concentration lower than that in other portion of the first layer. The second low-concentration portion has a second conductivity-type impurity concentration lower than that in other portion of the second layer. The first low-concentration portion is positioned at a level same as a level of the second low-concentration portion in a direction directed toward the first electrode from the second electrode.

12 Claims, 5 Drawing Sheets

(56) References Cited

U.S. PATENT DOCUMENTS

2008/0246079 A1  10/2008  Saito et al.
2013/0341751 A1* 12/2013  Ono ................... H01L 29/7811
                                                257/488

FOREIGN PATENT DOCUMENTS

JP    2008-258442    10/2008
JP    2010-045307     2/2010

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2018-169710, filed on Sep. 11, 2018; the entire contents of which are incorporated herein by reference.

FIELD

Embodiments relate to a semiconductor device and a method for manufacturing the same.

BACKGROUND

In a case where a metal oxide semiconductor field effect transistor (MOSFET) acts as a switching device for controlling electric power, it is required to suppress oscillation of avalanche current that flows in the turn-off operation, and reduce electromagnetic interference (EMI).

DETAILED DESCRIPTION

Figure 1:
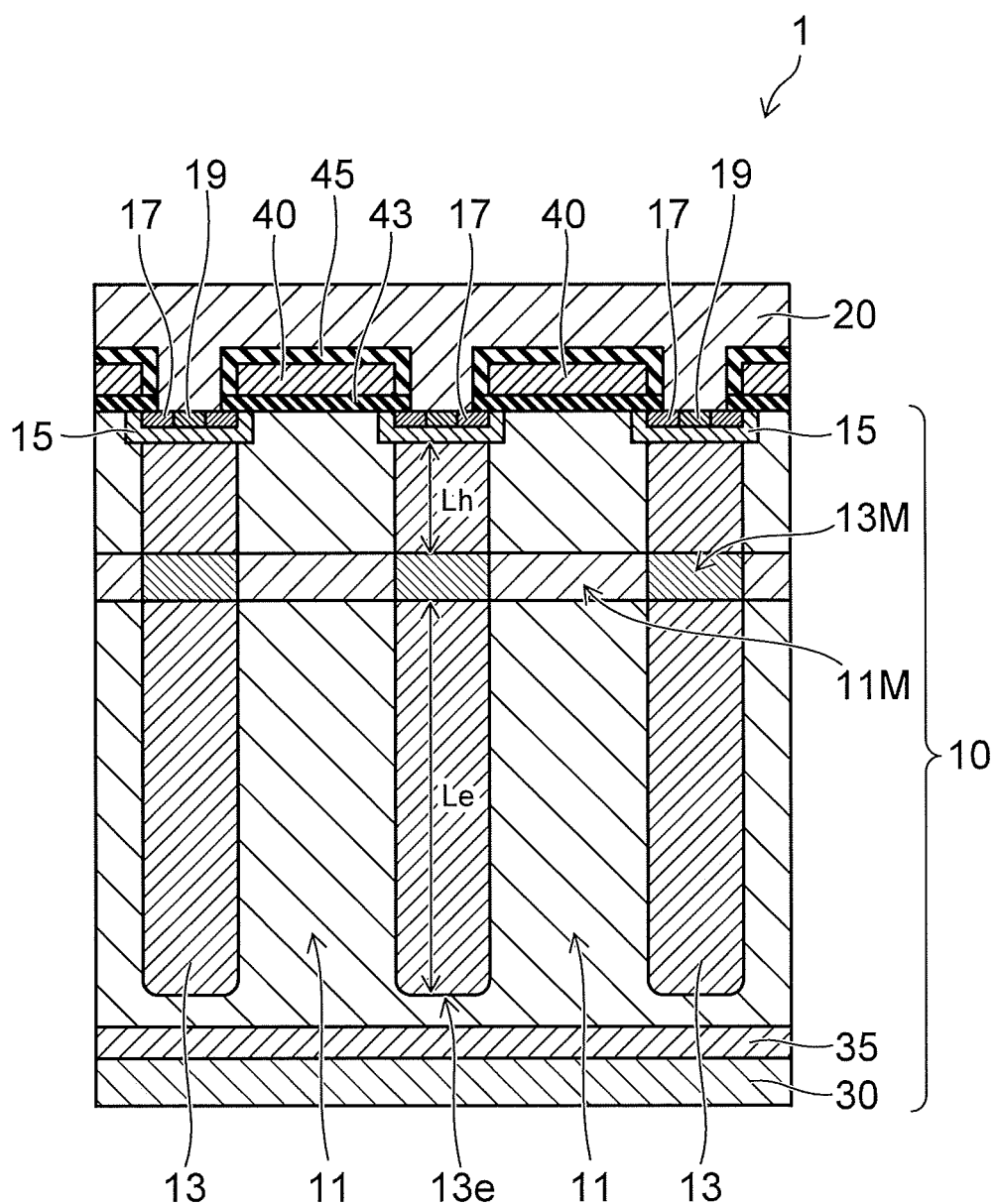
FIG. 1 is a schematic cross-sectional view showing a semiconductor device according to an embodiment.

According to one embodiment, a semiconductor device includes a semiconductor body, a first electrode, a second electrode and a control electrode. The first electrode partially contacts the semiconductor body. The first electrode contacts the front surface of the semiconductor body. The second electrode is provided on a side opposite to the first electrode with the semiconductor body interposed. The control electrode is provided between the semiconductor body and the first electrode. The semiconductor body includes a first semiconductor layer of a first conductivity type and a second semiconductor layer of a second conductivity type. The first semiconductor layer and the second semiconductor layer are alternately arranged in a first direction along a front surface of the semiconductor body. The semiconductor body further includes a third semiconductor layer of the second conductivity type and a fourth semiconductor layer of the first conductivity type. The third semiconductor layer is provided between the second semiconductor layer and the first electrode. The fourth semiconductor layer is selectively provided between the third semiconductor layer and the first electrode. The first semiconductor layer includes a first low-concentration portion. The first low-concentration portion has a first conductivity type impurity concentration lower than a first conductivity type impurity concentration in other portion of the first semiconductor layer. The second semiconductor layer includes a second low-concentration portion. The second low-concentration portion has a second conductivity type impurity concentration lower than a second conductivity type impurity concentration in other portion of the second semiconductor layer. The second low-concentration portion is positioned between an end of the second semiconductor layer on a second electrode side and a boundary of the second semiconductor layer and the third semiconductor layer. The first low-concentration portion is positioned at a level same as a level of the second low-concentration portion in a second direction directed toward the first electrode from the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 2:
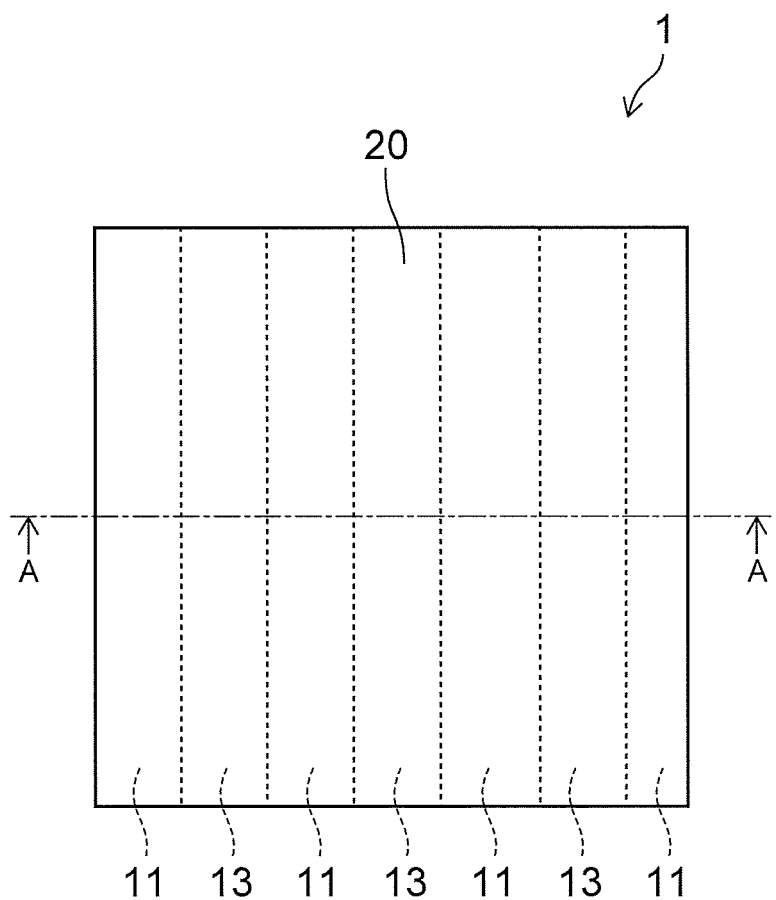
FIG. 2 is a schematic plan view showing the semiconductor device according to the embodiment.
Figure 2:
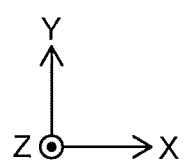

FIG. 1 is a schematic cross-sectional view showing a semiconductor device 1 according to an embodiment. FIG. 2 is a schematic plan view showing the semiconductor device 1 according to the embodiment. FIG. 1 is the schematic view showing cross-section taken along A-A line shown in FIG. 2.

As shown in FIG. 1, the semiconductor device 1 includes a semiconductor body 10, a source electrode 20, a drain electrode 30 and a gate electrode 40. The semiconductor body 10 is provided between the source electrode 20 and the drain electrode 30. The gate electrode 40 is provided between the semiconductor body 10 and the source electrode 20. The semiconductor device 1 is a so-called "vertical type MOSFET" in which electric current flows from the drain electrode 30 to the source electrode 20.

The gate electrode 40 is electrically isolated from the semiconductor body 10 with a gate-insulating film 43 interposed. The gate electrode 40 is electrically isolated from the source electrode 20 with an inter-layer insulating film 40 interposed.

As shown in FIG. 1 and FIG. 2, the semiconductor body 10 includes an n-type semiconductor layer 11 and a p-type semiconductor layer 13. The n-type semiconductor layer 11 and the p-type semiconductor layer 13 are formed into a plate shape extending in the Y-direction and the Z-direction. The n-type semiconductor layer 11 and the p-type semiconductor layer 13 are alternately arranged in a direction along the top surface of the semiconductor body 10 (e.g. in the X-direction).

The n-type semiconductor layer 11 includes a low-concentration portion 11M. The low-concentration portion 11M includes an n-type impurity having a lower concentration than a concentration of an n-type impurity included in other portion of the n-type semiconductor layer 11. The p-type semiconductor layer 13 includes a low-concentration portion 13M. The low concentration portion 13M includes a p-type impurity having a lower concentration than a concentration of a p-type impurity contained in other portion of the p-type semiconductor layer 13. The position (level) in the Z direction of the low concentration portion 11M in the n type semiconductor layer 11 is the same as the position (level) in the Z direction of the low concentration portion 13M in the p-type semiconductor layer 13.

The n-type impurity concentration in the low density portion 11M is, for example, $1 \times 10^{15}$ cm$^{-3}$ or more and $1 \times 10^{16}$ cm$^{-3}$ or less. On the other hand, the n-type impurity concentration in the other portion of the n-type semiconductor layer 11 is $1 \times 10^{16}$ cm$^{-3}$ or more. Further, the p-type impurity concentration in the low concentration portion 13M is, for example, $1 \times 10^{15}$ cm$^{-3}$ or more and $1 \times 10^{16}$ cm$^{-3}$ or less. On the other hand, the p-type impurity concentration in the other portion of the p-type semiconductor layer 13 is $1 \times 10^{16}$ cm$^{-3}$ or more.

The semiconductor portion 10 further includes a p-type diffusion layer 15, an n-type source layer 17, a p-type contact layer 19, and an n-type drain layer 35.

The p-type diffusion layer 15 is provided between the p-type semiconductor layer 13 and the source electrode 20. The p-type diffusion layer 15 includes, for example, a p-type impurity having a higher concentration than a concentration of a p-type impurity in the p-type semiconductor layer 13. The p-type diffusion layer 15 is electrically connected to, for example, the p-type semiconductor layer 13.

The n-type source layer 17 is selectively provided between the p-type diffusion layer 15 and the source electrode 20. The n-type source layer 17 includes, for example, an n-type impurity having a higher concentration than a concentration of an n-type impurity in the n-type semiconductor layer 11.

The p-type contact layer 19 is selectively provided between the p-type diffusion layer 15 and the source electrode 20. The p-type contact layer 19 and the n-type source layer 17 are arranged along the top surface of the semiconductor portion 10. The source electrode 20 is provided so as to be electrically connected to a portion of the n-type source layer 17 and the p-type contact layer 19. The p-type contact layer 19, for example, includes a p-type impurity having a higher concentration than a concentration of a p-type impurity in the p-type diffusion layer 15, and electrically connects the p-type diffusion layer 15 and the source electrode 20.

The gate electrode 40 is positioned, for example, between the n-type semiconductor layer 11 and the source electrode 20. The gate electrode 40 is provided so as to face part of the n-type semiconductor layer 11 and the p-type diffusion layer 15 with the gate insulating film 43 interposed. That is, when the gate bias is applied, the gate electrode 40 is provided so that an n-type inversion layer is formed on the surface of the p-type diffusion layer 15, and the n-type semiconductor layer 11 and the n-type source layer 17 are electrically conducted.

The n-type drain layer 35 is provided between the n-type semiconductor layer 11 and the drain electrode 30 and between the p-type semiconductor layer 13 and the drain electrode 30. The n-type drain layer 35 includes, for example, an n-type impurity having a higher concentration than the concentration of the n-type impurity in the n-type semiconductor layer 11. The n-type drain layer 35 is electrically connected to the drain electrode 30, for example.

Next, a method of manufacturing the semiconductor device 1 according to the embodiment is described with reference to FIGS. 3A to 4B. FIGS. 3A to 4B are schematic cross-sectional views sequentially showing the manufacturing process of the semiconductor device 1.

Figure 3A:
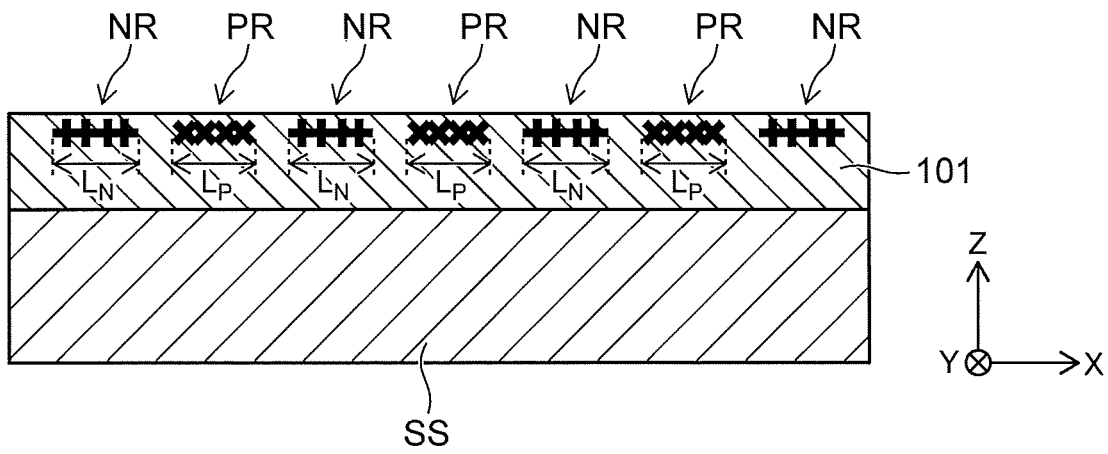
FIGS. 3A to 4B are schematic cross-sectional views showing manufacturing processes of the semiconductor device according to the embodiment.

As shown in FIG. 3A, a semiconductor layer 101 is formed on the semiconductor substrate SS. The semiconductor substrate SS is, for example, an n-type silicon wafer. The semiconductor layer 101 is, for example, a silicon layer epitaxially grown on the n-type silicon wafer. The semiconductor layer 101 is, for example, a so-called undoped layer grown under the condition in which no impurity is added. The semiconductor layer 101 includes, for example, an n-type impurity, or a p-type impurity, or both at the background level.

Subsequently, an n-type impurity and a p-type impurity are selectively ion-implanted into the semiconductor layer 101 using an implantation mask (not shown) to form an n-type implantation region NR and a p-type implantation region PR. The amount of n-type impurity introduced into the n-type implantation region NR is controlled by the dose amount of the n-type impurity and the width LN of the n-type implantation region NR (the opening width of the implantation mask). The amount of p-type impurity introduced into the p-type implantation region PR is controlled by the dose amount of the p-type impurity and the width LP of the p-type implantation region PR (the opening width of the implantation mask). The n-type impurity introduced into the n-type implantation region NR is controlled, for example, to be the same amount as that of the p-type impurity introduced into the p-type implantation region PR.

Figure 3B:
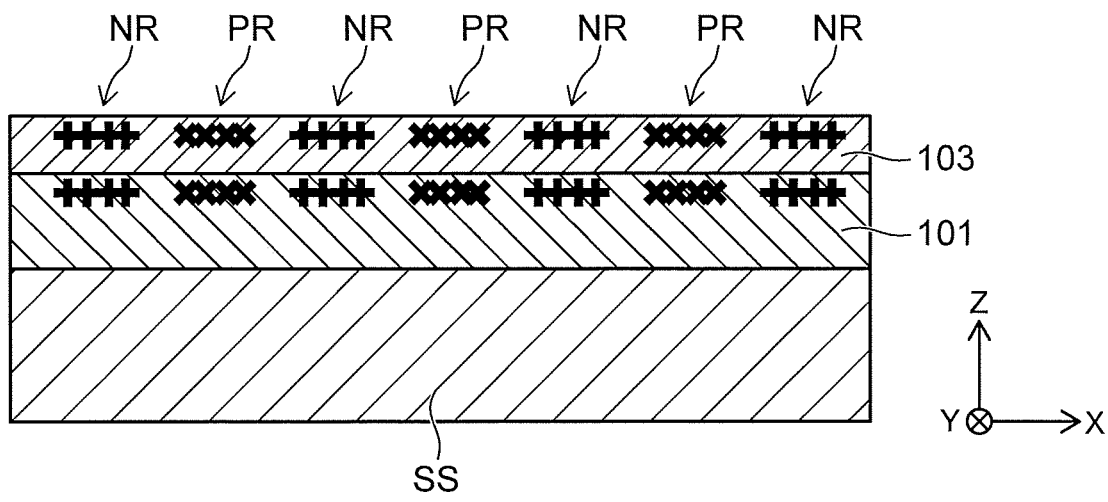

As shown in FIG. 3B, a semiconductor layer 103 is formed on the semiconductor layer 101. The semiconductor layer 103 is, for example, a silicon layer and is an undoped layer to which no impurity is added. Subsequently, an n-type impurity and a p-type impurity are selectively ion-implanted into the semiconductor layer 103 to form an n-type implantation region NR and a p-type implantation region PR. The n-type implantation region NR of the semiconductor layer 103 is formed immediately above the n-type implantation region NR of the semiconductor layer 101. The p-type implantation region PR of the semiconductor layer 103 is formed immediately above the p-type implantation region PR of the semiconductor layer 101. Also in this case, the n-type impurity introduced into the n-type implantation region NR is controlled to be, for example, the same amount as that of the p-type impurity introduced into the p-type implantation region PR.

Figure 3C:
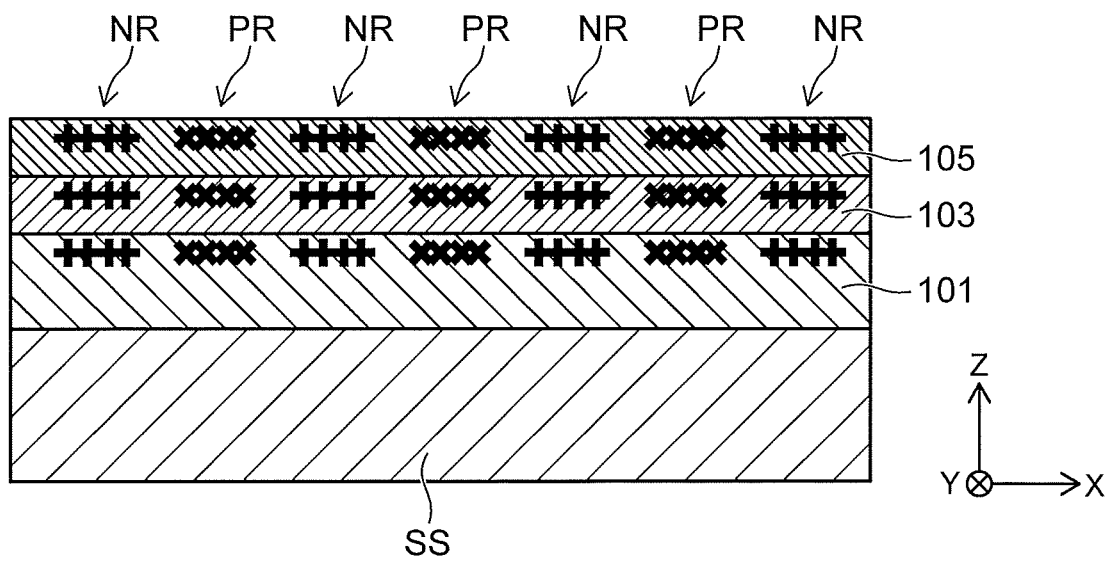

As shown in FIG. 3C, a semiconductor layer 105 is formed on the semiconductor layer 103. The semiconductor layer 105 is, for example, a silicon layer, and is an undoped layer to which no impurity is added. Subsequently, an n-type impurity and a p-type impurity are selectively ion-implanted into the semiconductor layer 105 to form an n-type implantation region NR and a p-type implantation region PR. The n-type implantation region NR of the semiconductor layer 105 is formed immediately above the n-type implantation region NR of the semiconductor layer 103. The p-type implantation region PR of the semiconductor layer 105 is formed immediately above the p-type implantation region PR of the semiconductor layer 103. The n-type impurity introduced into the n-type implantation region NR of the semiconductor layer 105 is controlled, for example, to be the same amount as that of the p-type impurity introduced in the p-type implantation region PR of the semiconductor layer 105.

Figure 4A:
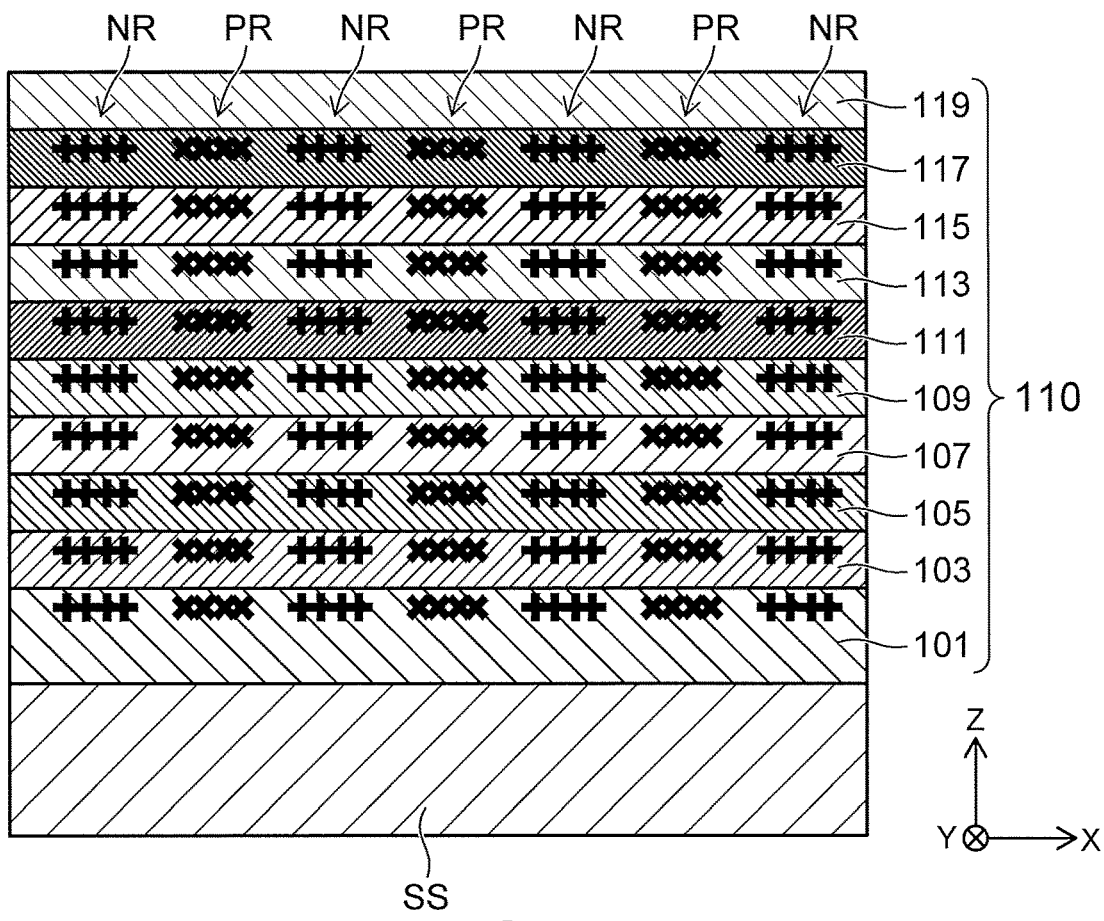

FIG. 4A is a schematic view showing a cross section of a stacked body 110. The stacked body 110 is formed by repeating the growth of an undoped semiconductor layer and the ion implantation of an n-type impurity and a p-type impurity. The stacked body 110 includes semiconductor layers 101, 103, 105, 107, 109, 111, 113, 115, 117 and 119 stacked on a semiconductor substrate SS.

The n-type implantation region NR and the p-type implantation region PR are formed in each semiconductor layer except the semiconductor layer 119. Neither the n-type impurity nor the p-type impurity is ion-implanted into the uppermost semiconductor layer 119. The semiconductor layer 119 is an undoped layer or an n-type layer in which an n-type impurity is doped during epitaxial growth so as to have the predetermined n-type impurity concentration.

As shown in FIG. 4A, the n-type implantation region NR and the p-type implantation region PR are formed so as to be arranged in the Z direction. The n-type implantation region NR formed in the semiconductor layer 113 is formed to include the n-type impurity having a smaller amount than an amount of the n-type impurity in the n-type implantation region NR that is formed in the other semiconductor layer. In addition, the p-type implantation region PR formed in the semiconductor layer 113 is formed so as to include the p-type impurity having a smaller amount than an amount of the p-type impurity in the p-type implantation region PR that is formed in the other semiconductor layer.

The amount of the n-type impurity introduced into the n-type implantation region NR formed in the semiconductor layer 113 is the same as the amount of the p-type impurity introduced into the p-type implantation region PR formed in the semiconductor layer 113. For example, the amount of impurities at the background level in the semiconductor layer 113 is one or more orders of magnitude less than the amount of the ion-implanted n-type impurity or the ion-implanted p-type impurity. Thus, in the semiconductor layer 113, when the amount of the n-type impurity in the n-type implantation region NR is the same as the amount of the p-type impurity in the p-type implantation region PR, the total amount of n-type impurities is substantially the same as the total amount of p-type impurities in the n-type implantation region NR and the p-type implantation region PR that are adjacent to each other in the X-direction. That is, the total amount of n-type impurities is balanced with the total amount of p-type impurities.

In each semiconductor layer excluding the semiconductor layers 113 and 119, the amount of n-type impurity in the n-type implantation region NR is substantially the same as the p-type impurity amount in the p-type implantation region PR. In other words, in each semiconductor layer excluding the semiconductor layers 113 and 119, the total amount of n-type impurities in the n-type implantation region NR and p-type implantation region PR adjacent to each other is balanced with the total amount of p-type impurities therein.

Figure 4B:
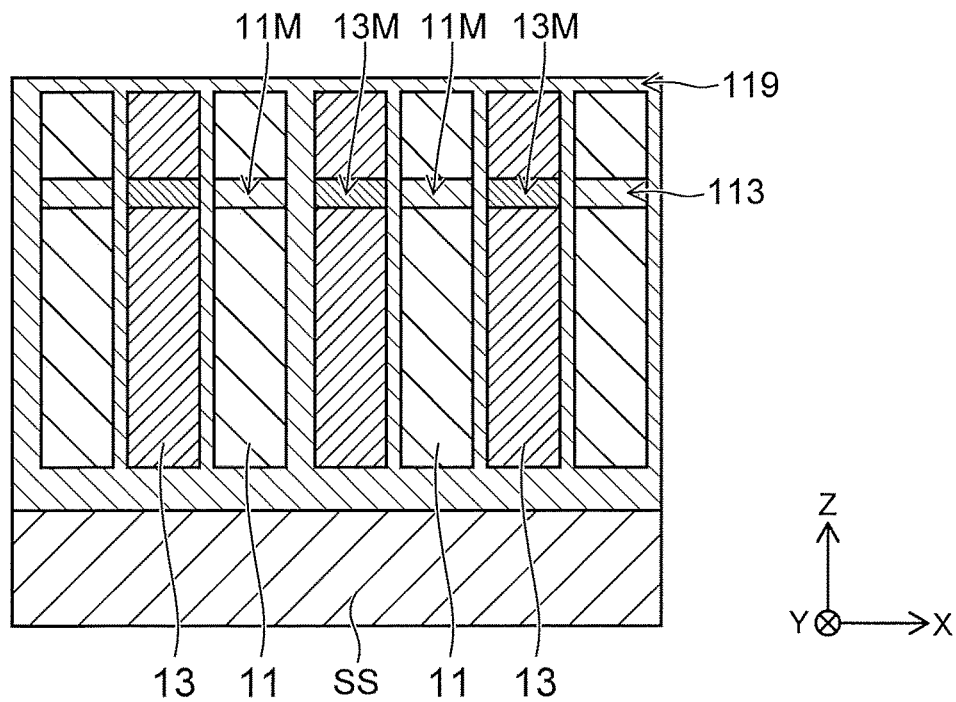

As shown in FIG. 4B, the n-type semiconductor layer 11 and the p-type semiconductor layer 13 are formed in the stacked body 110. The n-type semiconductor layer 11 and the p-type semiconductor layer 13 are formed by activating the ion-implanted n-type impurity and p-type impurity by heat treatment. In FIG. 4B, the semiconductor layers 101 to 119 are integrally shown as one semiconductor layer.

In the n-type semiconductor layer 11, a low concentration portion 11M is formed at a level corresponding to the position of the semiconductor layer 113. In the p-type semiconductor layer 13, a low concentration portion 13M is formed at a level corresponding to the position of the semiconductor layer 113.

Thereafter, a p-type diffusion layer 15, an n-type source layer 17 and a p-type contact layer 19 (see FIG. 1) are formed in a region corresponding to the uppermost semiconductor layer 119. Subsequently, after forming the gate electrode 40 and the source electrode 20, for example, the semiconductor substrate SS is thinned to form an n-type drain region 35. Further, the drain electrode 30 is formed to complete the semiconductor device 1.

Figure 5A:
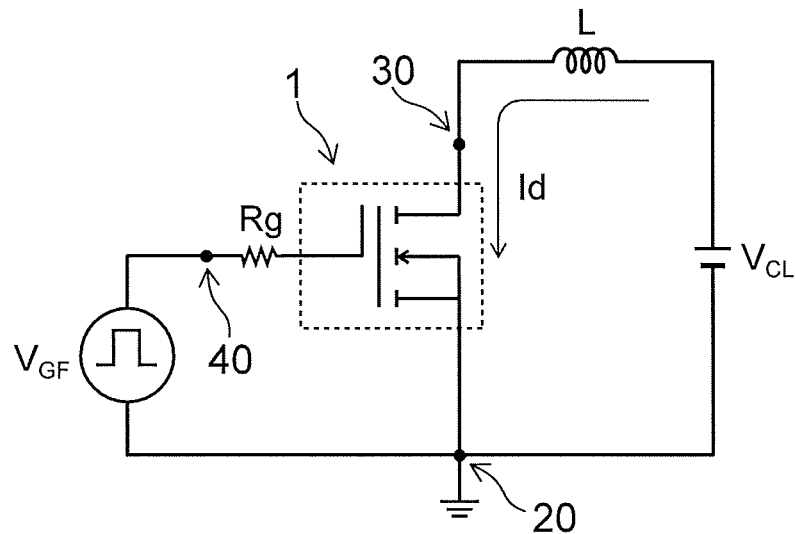
FIGS. 5A and 5B are schematic views showing a testing method of the semiconductor device according to the embodiment.
Figure 5B:
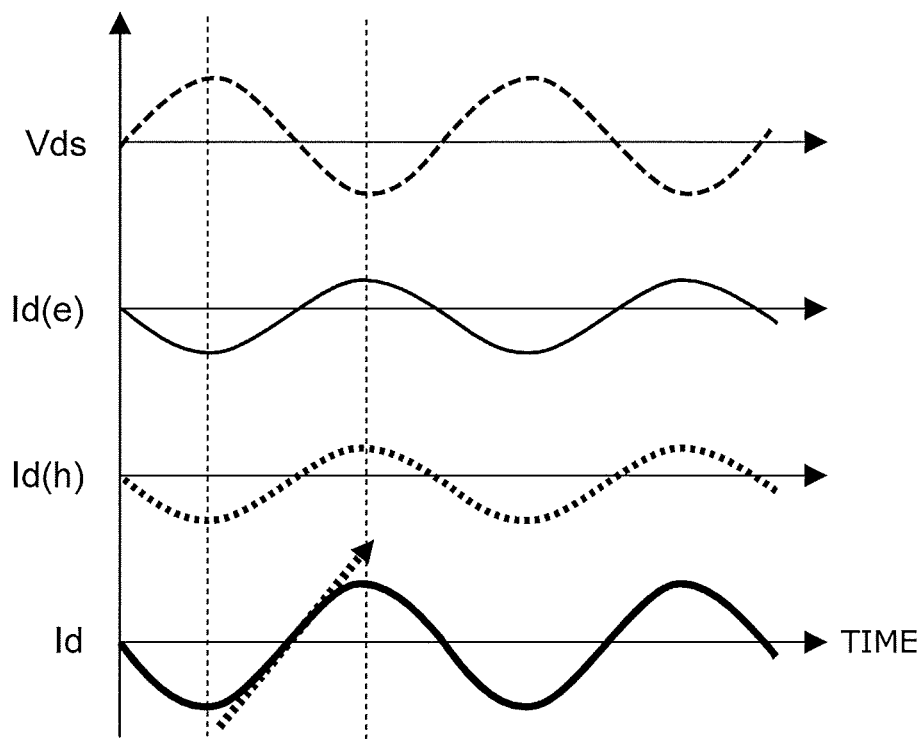

FIGS. 5A and 5B are schematic views showing a testing method of the semiconductor device 1 according to the embodiment. FIG. 5A is a schematic view showing the test apparatus. FIG. 5B is a time chart showing the drain voltage Vds, the electron current Id(e), the hole current Id(h), and the drain current Id.

As shown in FIG. 5A, a voltage is applied from the power supply VCL via the inductance L between the source electrode 20 and the drain electrode 30 of the semiconductor device 1. A gate bias VGF is applied to the gate electrode 40 of the semiconductor device 1. For example, the gate bias VGF is a pulse voltage having a constant cycle, and performs the ON/OFF control in the semiconductor device 1.

As shown in FIG. 5B, the drain voltage Vds applied between the source and drain varies corresponding to the period of the gate bias VGF. The drain current Id also varies corresponding thereto.

For example, when the gate bias higher than the threshold voltage is applied to the gate electrode 40, the n-type inversion layer is induced at the interface between the gate insulating film 43 and the p-type diffusion layer 15, and the n-type semiconductor layer 11 and the n-type source layer 17 are electrically conducted (see FIG. 1). In contrast, when the gate bias falls below the threshold value and the semiconductor device 1 is turned off, the n-type inversion layer disappears and the electrical conduction is interrupted between the n-type semiconductor layer 11 and the n-type source layer 17 (see FIG. 1). At this time, space charges remaining in the n-type semiconductor layer 11 are discharged to the source electrode 20 via the p-type diffusion layer 15 and discharged to the drain electrode 30 via the n-type drain layer 35.

For example, when the semiconductor device 1 is turned off, the n-type semiconductor layer 11 and the p-type semiconductor layer 13 are depleted, and high electric field is induced between the p-type diffusion layer 15 and the n-type drain layer 35. For example, the electrons in the n-type semiconductor layer 11 are accelerated by the electric field, collide with the lattice atoms constituting the n-type semiconductor layer 11, and ionize the lattice atoms. Thereby, new electron-hole pairs are generated. The number of electrons and holes in the depletion layer increases as this process continues, and the avalanche current flows.

At this time, when the electron current Id(e) by the electrons discharged to the drain electrode 30 through the n-type drain layer 35 and the hole current Id(h) by the holes discharged to the source electrode 20 via the p-type diffusion layer 15 have phases that coincide with each other, the avalanche current resonance occurs and the excessive current flows. Thus, there may be a case where the semiconductor device 1 is destroyed. Even when the semiconductor device 1 is not destroyed, it is difficult to avoid EMI.

The electron current Id(e) and the hole current Id(h) may have the same phases, for example, in the case where the time required for the electrons generated by the impact-ionization to reach the n-type drain layer 35 coincides with the time required for the holes to reach the p-type diffusion layer 15. In order to avoid this, for example, it is preferable to make the impact-ionization occur at a position in the n-type semiconductor layer 11 different from the position where the electron and hole generated by the impact-ionization simultaneously reach the n-type drain layer 35 and the p-type diffusion layer 15, respectively.

In the embodiment, it is possible to suppress the impact-ionization by reducing the electric field in the low concentration portion 11M provided in the n-type semiconductor layer 11. Further, the charge balance in the n-type semiconductor layer 11 and the p-type semiconductor layer 13 is maintained by providing the low concentration portion 13M in the p-type semiconductor layer 13. Thereby, it is possible to make the n-type semiconductor layer 11 and the p-type semiconductor layer 13 being uniformly depleted, and prevent the electric field concentration in the vicinity of the low concentration portion 11M and the low concentration portion 13M. As a result, it is possible to reduce electrons and holes simultaneously reaching the n-type drain layer 35 and the p-type diffusion layer 15, thereby avoiding the avalanche current oscillation.

For example, distances Lh and Le is provided in the p-type semiconductor layer 13. The distance Lh is defined as a distance from the low-density portion 13M to the p-type diffusion layer 15, and the distance Le is defined as a distance from the low-density portion 13M to the end 13e of the p-type semiconductor layer 13 on the drain electrode side (See FIG. 1). For example, the mobility of electrons in silicon is greater than the mobility of holes in silicon. Thus, by making the distance Le longer than the distance Lh, it is possible to reduce the electric field at the position where electrons and holes are generated and simultaneously reach the n-type drain layer 35 and the p-type diffusion layer 15. Thereby, the avalanche current oscillation can be suppressed.

For example, in a low electric field region where the electron mobility in silicon does not reach the saturation value, the electron mobility is roughly three times the hole mobility. Therefore, it is preferable that the distance Le be three times the distance Lh. In the high electric field region where the electron mobility in silicon reaches the saturation value, the ratio of the electron mobility to the hole mobility is 1:0.6. Therefore, the ratio of the distance Le to the distance Lh is preferable to be set to 1:0.6. That is, it is more preferable that the ratio of the distance Le to the distance Lh is set to be the same as or substantially the same as the ratio of the electron mobility to the hole mobility.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a semiconductor body including a first semiconductor layer of a first conductivity type and a second semiconductor layer of a second conductivity type, the semiconductor body having a front surface and a back surface opposite to the front surface, the first semiconductor layer and the second semiconductor layer being alternately arranged in a first direction along the front surface of the semiconductor body;
    a first electrode partially contacting the front surface of the semiconductor body;
    a second electrode provided on the back surface of the semiconductor body, the semiconductor body being provided between the first electrode and the second electrode; and
    a control electrode provided between the semiconductor body and the first electrode,
    the semiconductor body further including a third semiconductor layer of the second conductivity type and a fourth semiconductor layer of the first conductivity type, the third semiconductor layer being provided between the second semiconductor layer and the first electrode, the fourth semiconductor layer being selectively provided between the third semiconductor layer and the first electrode,
    the first semiconductor layer including a first portion, a second portion, and a third portion arranged in a second direction from the second electrode to the first electrode, the second portion of the first semiconductor layer being provided between the first portion and third portions of the first semiconductor layer,
    the second portion of the first semiconductor layer including first conductivity type impurities with a concentration lower than a concentration of first conductivity type impurities in the first portion of the first semiconductor layer and a concentration of first conductivity type impurities in the third portion of the first semiconductor layer, the second portion of the first semiconductor layer having a second width in the second direction smaller than a first width in the second direction of the first portion of the first semiconductor layer and a third width in the second direction of the third portion of the first semiconductor layer,
    the second semiconductor layer including a first portion, a second portion and a third portion arranged in the second direction, the second portion of the second semiconductor layer being provided between the first portion and third portions of the second semiconductor layer,
    the second portion of the second semiconductor layer including second conductivity type impurities with a concentration lower than a concentration of second conductivity type impurities in the first portion of the second semiconductor layer and a concentration of a second conductivity type impurities in the third portion of the second semiconductor layer, the second portion of the second semiconductor layer having a second width in the second direction smaller than a first width in the second direction of the first portion of the second semiconductor layer and a third width in the second direction of the third portion of the second semiconductor layer,
    the second portion of the first semiconductor layer being provided at a level in the second direction same as a level in the second direction of the second portion of the second semiconductor layer.

2. The semiconductor deviceaccording to claim 1, wherein an amount of the first conductivity type impurities in the second portion of the first semiconductor layer is in balance with an amount of the second conductivity type impurities in the second portion of the second semiconductor layer.

3. The semiconductor device according to claim 1, wherein the third portion of the first semiconductor layer is provided between the second portion of the first semiconductor layer and the first electrode, and the third width of the third portion of the first semiconductor layer is smaller than the first width of the first portion of the first semiconductor layer.

4. The semiconductor device according to claim 3, wherein a ratio of the third width to the first width in the first semiconductor layer is substantially same as a ratio of a hole mobility to an electron mobility in the first semiconductor layer.

5. The semiconductor device according to claim 3, wherein a ratio of the third width to the first width is 1:3.

6. The semiconductor device according to claim 3, wherein a ratio of the third width to the first width is 0.6:1.

7. The semiconductor device according to claim 1, wherein
a total amount of the first conductivity type impurities in the first semiconductor layer is in balance with a total amount of the second conductivity type impurities in the second semiconductor layer.

8. The semiconductor device according to claim 1, wherein the first semiconductor layer and the second semiconductor layer extend along the front surface of the semiconductor body in a third direction crossing the first direction.

9. The semiconductor device according to claim 1, wherein
the third semiconductor layer includes second conductivity type impurities with a higher concentration than a concentration of the second conductivity type impurities in the second semiconductor layer,
the fourth semiconductor layer includes a-first conductivity type impurities with a higher concentration than a concentration of the first conductivity type impurities in the first semiconductor layer, and
the third semiconductor layer and the fourth semiconductor layer are electrically connected to the first electrode.

10. The semiconductor device according to claim 1, wherein
the semiconductor body further includes a fifth semiconductor layer of the first conductivity type provided between the first semiconductor layer and the second electrode and between the second semiconductor layer and the second electrode, the fifth semiconductor layer including first conductivity type impurities with a higher concentration than a concentration of the first conductivity type impurities in the first semiconductor layer, and
the second electrode is in contact with the fifth semiconductor layer and is electrically connected to the fifth semiconductor layer.

11. The semiconductor device according to claim 1, wherein
the control electrode is electrically isolated from the semiconductor body with a first insulating film interposed, and is electrically isolated from the first electrode with a second insulating film interposed, the control electrode being provided on a portion of the third semiconductor layer with the first insulating film interposed, the portion of the third semiconductor layer being positioned, in the first direction, between the first semiconductor layer and the fourth semiconductor layer.

12. The semiconductor device according to claim 1, further comprising:
a plurality of control electrodes arranged in the first direction along the front surface of the semiconductor body,
the first electrode being electrically connected to the third semiconductor layer and the fourth semiconductor layer between adjacent control electrodes in the plurality of control electrodes.

* * * * *